United States Patent [19]
Freidin et al.

[11] Patent Number: 5,631,577
[45] Date of Patent: May 20, 1997

[54] SYNCHRONOUS DUAL PORT RAM

[75] Inventors: Philip M. Freidin, Sunnyvale; Edmond Y. Cheung, San Jose; Charles R. Erickson; Tsung-Lu Syu, both of Fremont, all of Calif.

[73] Assignee: Xilinx, Inc., San Jose, Calif.

[21] Appl. No.: 668,276

[22] Filed: Jun. 21, 1996

Related U.S. Application Data

[62] Division of Ser. No. 386,972, Feb. 10, 1995, Pat. No. 5,566,123.

[51] Int. Cl.$^6$ ........................ H03K 19/177; G11C 13/00
[52] U.S. Cl. .......................... 326/40; 365/230.05
[58] Field of Search .................. 326/39, 40, 46; 365/230.05

[56]  References Cited

U.S. PATENT DOCUMENTS

5,448,522  9/1995  Huang ............................. 365/230
5,493,536  2/1996  Aoki ............................... 365/230
5,513,139  4/1996  Butler ............................. 365/230
5,559,450  9/1996  Ngai et al. ....................... 326/40

*Primary Examiner*—Edward P. Westin
*Assistant Examiner*—Richard Roseen
*Attorney, Agent, or Firm*—Jeanette S. Harms

[57]  ABSTRACT

A configurable logic block (CLB) in the dual port mode uses one address to write the same information in a first RAM and a second RAM. The input signals provided to the second function generator can be used to read, independently from and even asynchronously with, the write operation, thereby dramatically increasing the speed of applications using the two sets of RAM. A CLB in the synchronous mode latches the appropriate address and data signals, and generates a strobed write enable signal. The strobed signal is self-timed, i.e. the write operation is fully automatic, thereby ensuring that a write operation occurs within one clock cycle.

10 Claims, 7 Drawing Sheets

SYNCHRONOUS DUAL PORT RAM

This application is a division of application Ser. No. 08/386,972, filed Feb. 10, 1995, now U.S. Pat. No. 5,566,123.

BACKGROUND OF THE INVENTION

1. Field of the Invention

The present invention relates to a function generator used as a random access memory (RAM), and in particular to a function generator having a synchronous, dual port RAM capability.

2. Description of the Related Art

Static random access memory (hereinafter RAM) is well known in the art. A RAM has two fundamental operating modes: a read mode and a write mode. In a read mode, a write enable input signal is inactive, wherein the RAM operates as a read only memory (ROM), i.e. the data stored by the RAM cannot be changed. In this mode, the data stored at the RAM cell location defined by the address inputs is provided as an output signal.

In a write mode, the write enable input signal is active, thereby allowing data to be written into the RAM cell location specified by the address lines. However, the timing of this operation is critical to ensure that the data is written to only the specified RAM cell location and that other cell locations are left undisturbed. Specifically referring to FIG. 1, write cycle 105 is initiated by a falling edge of system clock signal 101. The active (i.e logic one) write enable (WE) signal 104 is not asserted until shortly after the address signals 102 are stable. The active WE signal 104 must last for at least a specified minimum time period 106. Additionally, address signals 102 must stay constant during and preferably even for a specified hold time beyond the end of active WE signal 104. Data signal 103 must also be constant for a specified time before the end of active WE signal 104, as well as for a predetermined time after the end of active WE signal 104. If any of these requirements are violated, the data may not be written properly into the desired RAM location, and/or it may be written into an undesired location.

Figure 2:
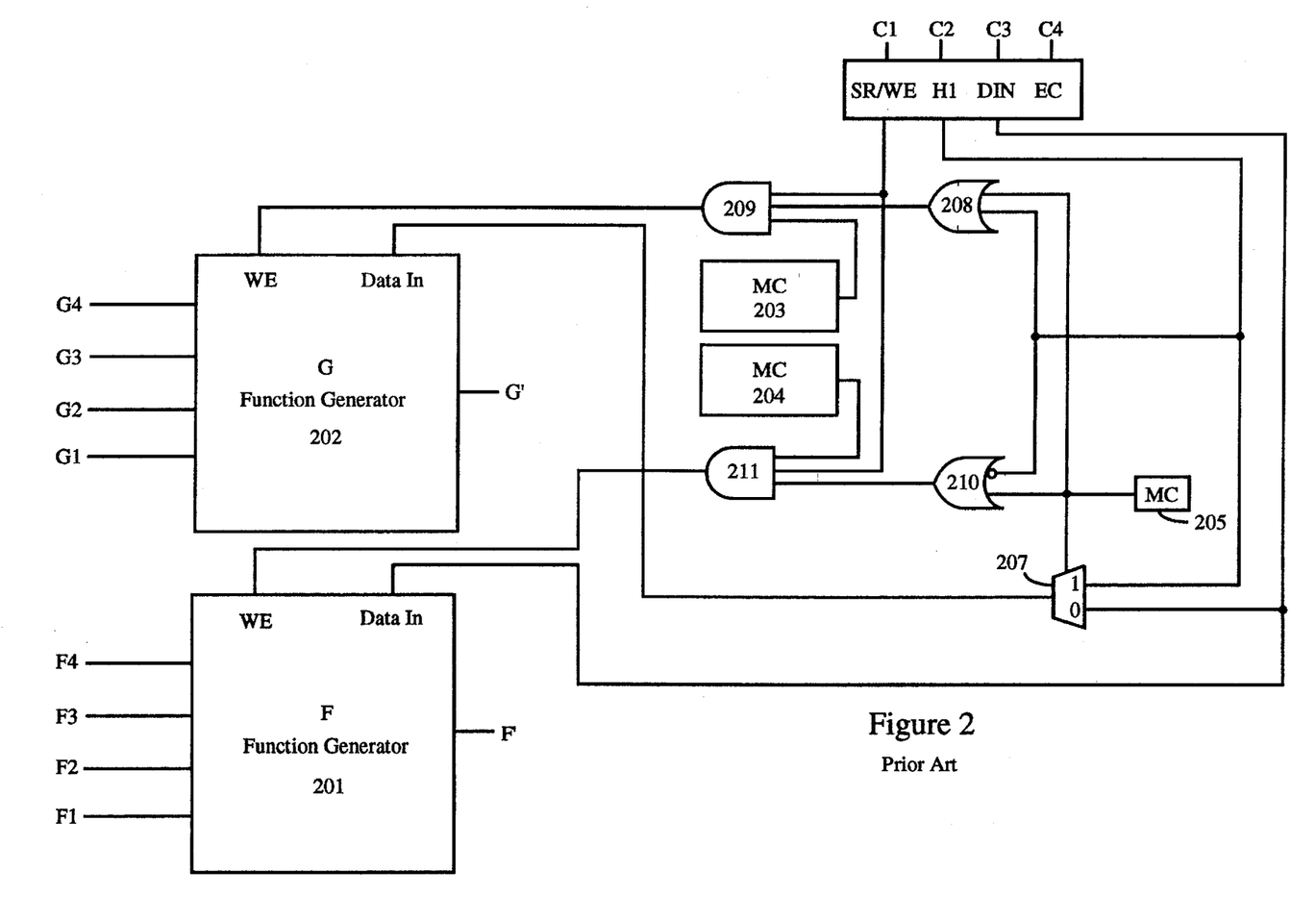
FIG. 2 shows a portion of a configurable logic block including two function generators configurable as RAM.

FIG. 2 illustrates one portion of a configurable logic block (CLB) including two function generators 201 and 202 (also commonly referred to as F and G function generators, respectively). Function generators are typically implemented using look-up tables (LUTs), which in turn typically comprise a plurality of RAM cells. The use of RAM for function generators is described in further detail in U.S. Pat. No. Re. 34,363, reissued on Aug. 31, 1993, which is incorporated by reference in its entirety. In the embodiment shown in FIG. 2, each function generator comprises a 16×1 LUT. Four CLB input signals F1–F4 determine which of the sixteen stored RAM values is provided on output line F'. In a similar manner, four CLB input signals G1–G4 determine which of the sixteen stored RAM values is provided on output line G'.

Control signals C1–C4 can each generate any one of four logic signals. In FIG. 2, these four logic signals include: enable clock (EC), write enable (WE), a first data signal (DIN), and a second data signal (H1). The WE signal is provided to both AND gates 209 and 211. If the WE signal is low (i.e. inactive), then function generators 101 and 102 perform as typical CLB function generators (i.e. having only ROM capability). However, if the WE signal is high (i.e. active), then both function generators 201 and 202 will be written to assuming other preconditions are met. For example, memory cells 203 and 204 determine whether one of or both of function generators 201 and 202 fail to receive the active WE signal. For example, if memory cell 204 stores a logic low signal, then function generator 201 is disabled for write access and performs only as a ROM. Thus, memory cells 203 and 204 provide an additional means for RAM write deselection. However, even if both of the above-described enabling conditions are met, memory cell 205 and data signal H1 may disable the RAM write functionality of one of function generators 201 and 202.

Memory cell 205 provides two functions. First, a predetermined logic state stored in memory cell 205 controls multiplexer 207, thereby determining whether function generators 201 and 202 are configured as two 16×1 RAMs with two data inputs and two data outputs (i.e. function generator 202 receiving data signal H1 and function generator 201 receiving data signal DIN) or as one 32×1 RAM with one data input (i.e. function generators 201 and 202 both receiving data signal DIN). Note that additional circuitry, i.e. a multiplexer (not shown), determines which output line (line F' or line G') provides the output signal for the 32×1 RAM.

Second, that predetermined logic state is also provided to OR gates 208 and 210. If that predetermined logic state is high (and assuming signal WE is high and memory cells 203/204 store logic high signals), the RAM write capability of function generators 201 and 202 is enabled. In this configuration, function generator 202 is written with data signal H1 and function generator 201 is written with data signal DIN (a 16×2 configuration). On the other hand, if that predetermined logic state of memory cell 205 is low, data signal H1 determines which of function generators 201 and 202 provides the RAM write capability. In other words, data signal H1 functions as another address signal for the 32×1 RAM.

Figure 1:
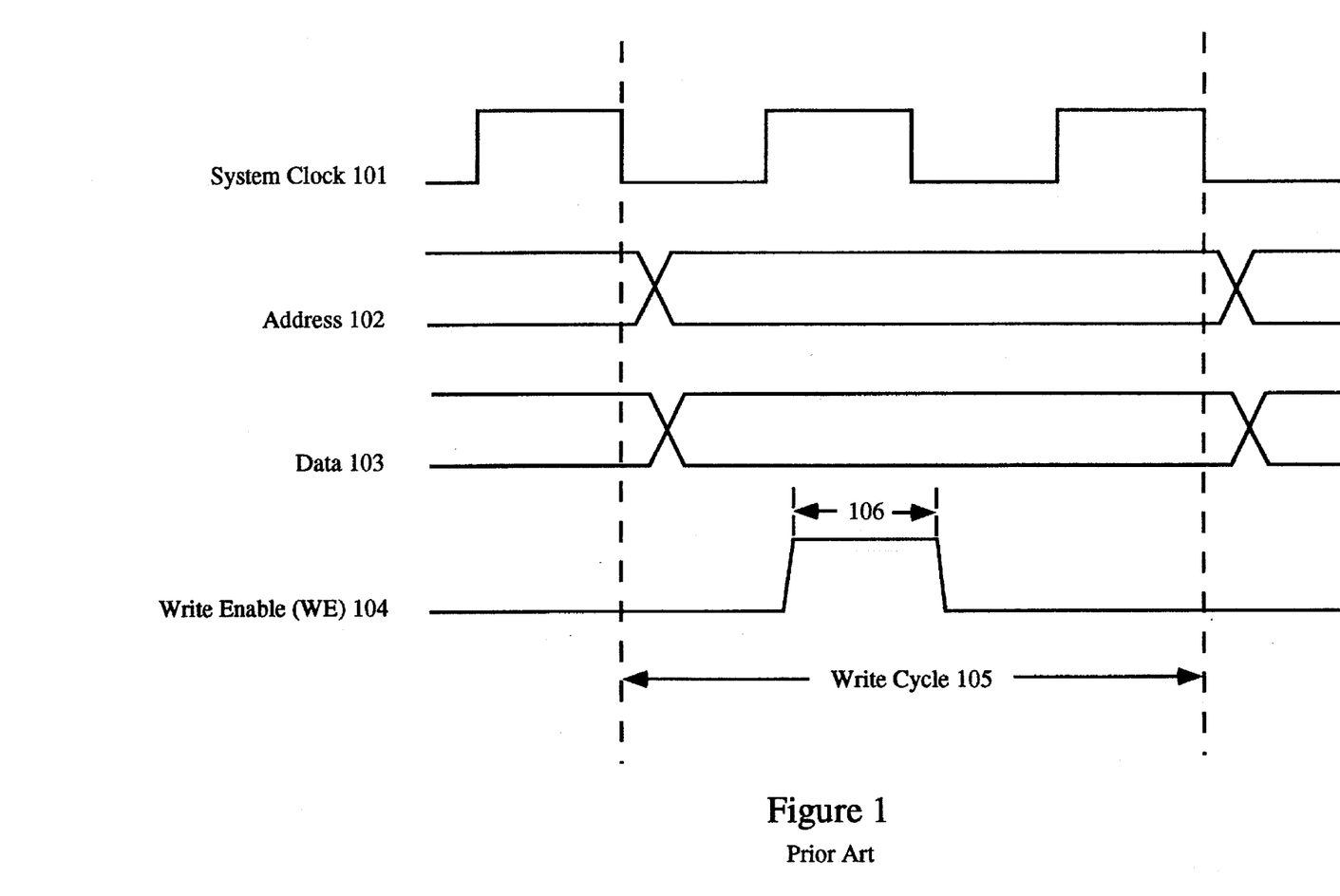
FIG. 1 illustrates timing diagrams for a function generator acting as a RAM in a known programmable logic device.

Referring to FIGS. 1 and 2, assuming that the high portion of system clock signal 101 is used to generate write enable signal WE, when system clock signal 101 goes low, write enable signal WE must go low. Additionally, the new address and data signals for the following cycle must be generated. However, the speed associated with each of these operations may vary. For example, if the speed to generate a new address is faster than the speed to turn off the write enable signal WE, then the timing requirements of the system are violated. As previously noted, if any of the timing requirements are violated, the data may not be written properly into the desired RAM location, and/or it may be written into an undesired location.

To ensure that a data signal is written to only the specified location and that other cell locations are left undisturbed, the user usually must wait one clock cycle before another write cycle 105 can begin, i.e. to generate a new address. The 1994 Xilinx Data Book, which is incorporated by reference in its entirety, describes one solution to this problem on pages 8–139 through 8–147. In this solution, a global clock is used as a write enable signal. However, in this solution, every cycle is a write cycle, thereby requiring a read output signal (i.e. the output signal of function generator 201 or 202 when the function generator acts as a ROM) to be fed back to its data input terminal to write the old data when a write cycle is undesired. This feedback operation necessitates the use of flip-flops and a multiplexer which significantly increases the required logic. Moreover, the address is generated by the falling clock edge, leaving only the clock low time to generate and route the address and accommodate the data set-up time. Thus, the above-described solution sacrifices density and speed to achieve reliable performance.

Therefore, a need arises for a logic circuit which eliminates the above-described time delays without increasing the required logic cost.

SUMMARY OF THE INVENTION

In accordance with the synchronous RAM capability of the present invention, write strobe logic provides a fully automatic write operation immediately following a clock edge, thereby eliminating the undesired hold time requirements caused by the routing delay in generating and distributing the write enable signal of the prior art. Specifically, in one embodiment of the present invention, an edge of a clock signal triggers the latching of the address and data signals associated with a plurality of function generators. The same edge triggers the sampling of a user-supplied write enable signal.

If the write enable signal is active, the write strobe logic generates a one-shot write strobe signal for each of function generators that writes the latched data into the memory cell (RAM) that is addressed by the latched address. The write strobe logic ensures the width of the write strobe signal is enough to successfully write to a memory cell by monitoring a plurality of dummy memory cells, one pair for each write strobe signal. If the write strobe signals are not active, one dummy memory cell in the pair is initialized to zero and the other dummy memory cell in the pair is initialized to one. After the write strobe signal goes active, these dummy memory cells are written to their respective opposite states. The write strobe signal is terminated when the data in the dummy memory cells have been flipped. Another write operation is triggered by the next clock edge. The write strobe logic of the present invention decreases the required logic cost by eliminating the need for additional flip-flops or multiplexers to register address and output signals while significantly increasing the speed.

Additionally, the present invention provides a dual port configuration in which an address for a first function generator is provided to the Read and Write Address terminals of the first function generator as well as to the Write Address terminals of a second function generator. The address for the second function generator is the Read Address of the second function generator. This configuration allows the user to perform simultaneous, independent Read and Write operations in the second function generator.

DETAILED DESCRIPTION OF THE DRAWINGS

Figure 3:
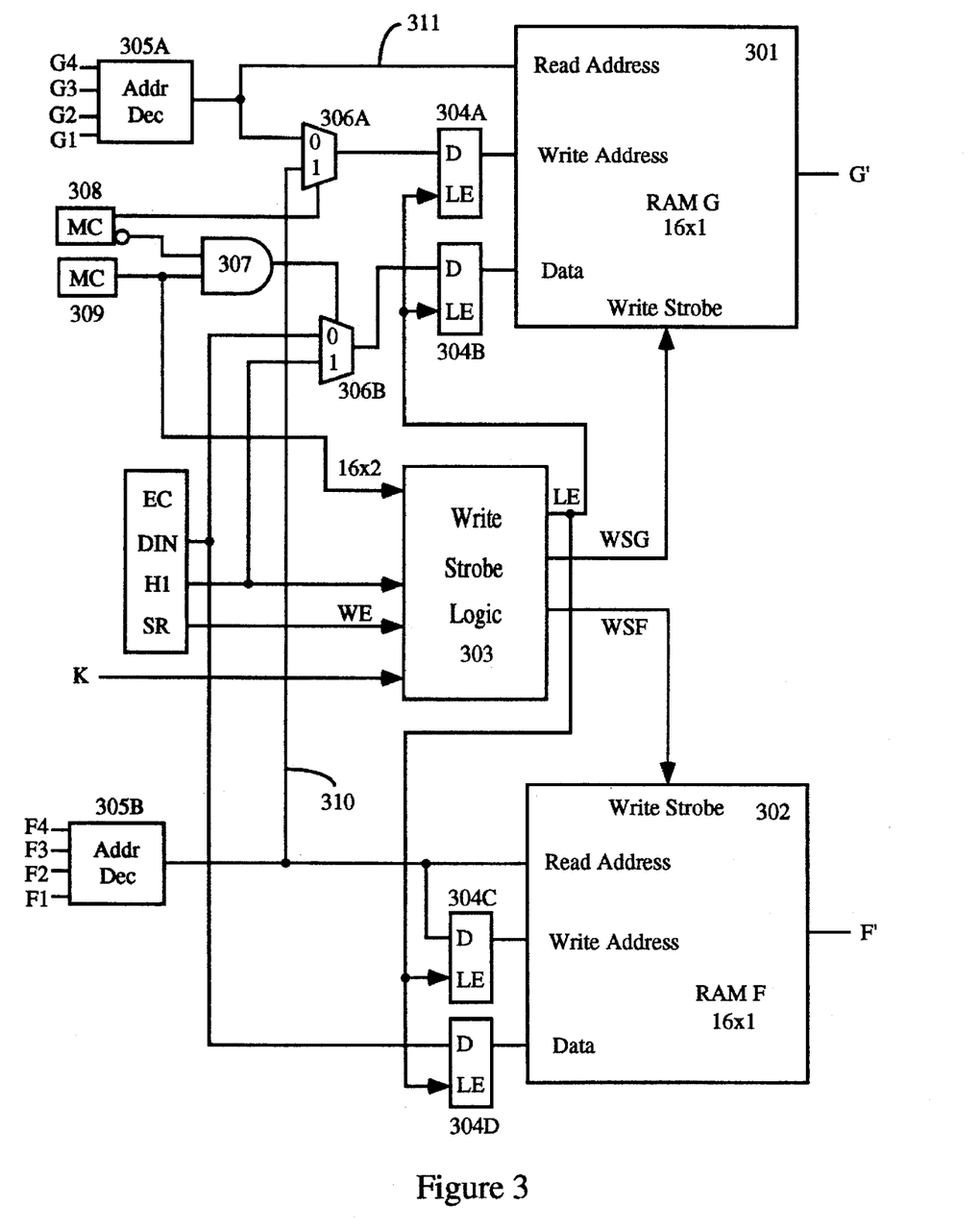
FIG. 3 illustrates a CLB configuration including a synchronous, dual port RAM in accordance with the present invention.

FIG. 3 illustrates a portion of a configurable logic block (CLB) which includes a function generator 301 having a dual port RAM. Specifically, address decoder 305A provides signals to the Read Address terminals of function generator 301 as well as to multiplexer 306A. Similarly, address decoder 305B provides signals to the Read Address terminals of function generator 302 as well as to multiplexer 306A. Multiplexer 306A provides output signals to the D input terminals of latch 304A which, in its transparent state (typically invoked upon receiving a logic one latch enable (LE) signal), provides those signals to the Write Address terminals of function generator 301.

Figure 6A:
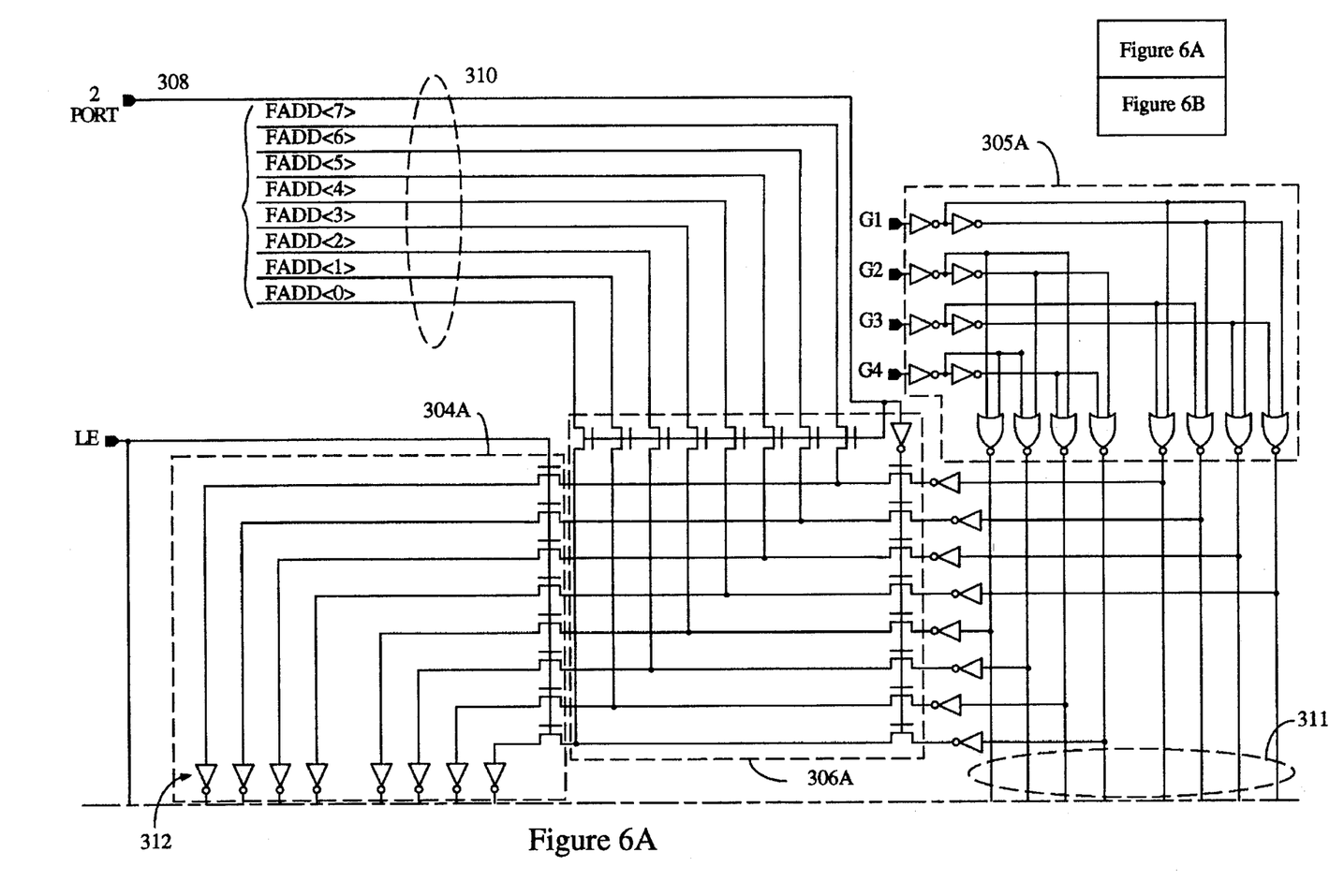
FIGS. 6A and 6B show an address decoder, a multiplexer, and a function generator which illustrates the dual port capability of the present invention and one embodiment of a latch.
Figure 6B:
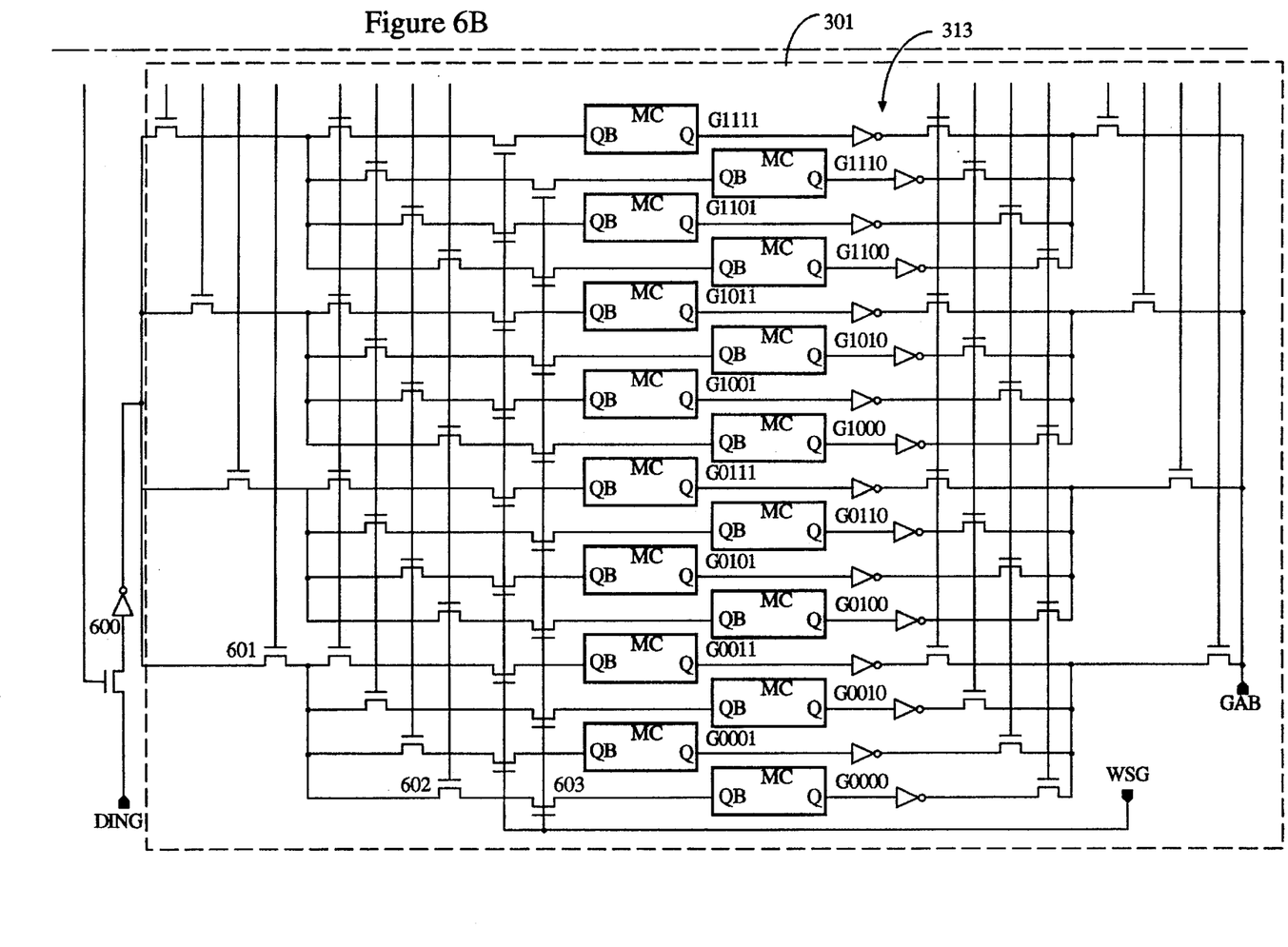

FIGS. 6A and 6B illustrates multiplexer 306A, address decoder 305A, latch 304A, and function generator 301 in greater detail. In this embodiment, latch 304A is formed using pass transistors which temporarily store the signals in the gate capacitance of inverters 312 (provided a low latch enable signal LE is asserted). Note that numerous embodiments of latch 304A are acceptable in the present invention. For example, in one embodiment, latch 304A is implemented as a static latch.

Function generator 301 is configured such that during a write operation, the $\overline{Q}$ terminals of the memory cells are accessed. However, during a standard read operation the signals stored on the Q terminals of the memory cells are accessed. Therefore, inverters 313 are provided to ensure a $\overline{Q}$ output signal.

Referring back to FIG. 3, the dual port mode is enabled by memory cell 308 providing a logic one control signal to multiplexer 306A, thereby transferring the address signals of address decoder 305B rather than the address signals of address decoder 305A to latch 304A. Note that if the synchronous RAM mode (explained in detail below) is not selected, then latch enable signal LE is high, thereby ensuring latches 304 are in their transparent state.

If the dual port mode is selected, the write location in function generator 301 is decoded from input signals F1–F4, and the read location is decoded from input signals G1–G4. Function generator 301 therefore has independent and asynchronous read and write addresses. In this manner, the user has the ability to simultaneously read a predetermined RAM cell designated by the input signals G1–G4 as well as the ability to write to a second predetermined RAM cell designated by the input signals F1–F4.

Because memory cell 308 stores a logic one in the dual port mode, a logic zero signal is then provided to one of the input terminals of AND gate 307, thereby ensuring a logic zero output signal from this gate. This logic zero output signal activates multiplexer 306B to transfer the data signal DIN to a latch 304B which upon receiving a high latch enable signal LE (i.e. activating its transparent state) transfers the data signal DIN to the Data input terminal of function generator 301. Note that the data signal DIN is also provided to a latch 304D, which upon being enabled by the same latch enable signal LE as latch 304B, transfers the data signal DIN to the Data input terminal of function generator 302. Therefore, in the dual port mode, data signal DIN is written to both function generator 301 and function generator 302. Because input signals F1–F4 are used to address both function generators in a write cycle, the RAM cells of function generator 301 will contain an exact copy of the RAM cells of function generator 302. Reading of the function generators 302 and 301 are independently addressed by input signals F1–F4 and G1–G4, respectively.

In a non-dual port mode, memory cell 308 stores a logic zero signal. That signal, provided to the control terminal of multiplexer 306A, transfers the address specified by input signals G1–G4 to latch 304A, which in its transparent state, is then provided to the Write Address terminals of function generator 301. Note that in this mode a logic one signal is provided to AND gate 307. Thus, the data signals provided to function generator 301 depend on the signal stored by memory cell 309. Specifically, if the signal stored by memory cell 309 is a logic one, then AND gate 307 outputs a logic one control signal to multiplexer 306B. This logic one signal activates multiplexer 306B to transfer data signal H1 to latch 304B. Once again, this signal is provided to the Data terminal of function generator 301 upon receiving a high latch enable signal LE.

On the other hand, if the signal stored by memory cell 309 is a logic zero, then AND gate 307 outputs a logic zero control signal to multiplexer 306B. This logic zero signal activates multiplexer 306B to transfer data signal DIN to latch 304B. Signal DIN is provided to the Data terminal of function generator 301 upon receiving a high latch enable signal LE. Thus, in the non dual port mode, memory cell 309 determines whether the RAM cells of function generators 301 and 302 are formed in two 16×1 arrays or a single 32×1 array.

Figure 4:
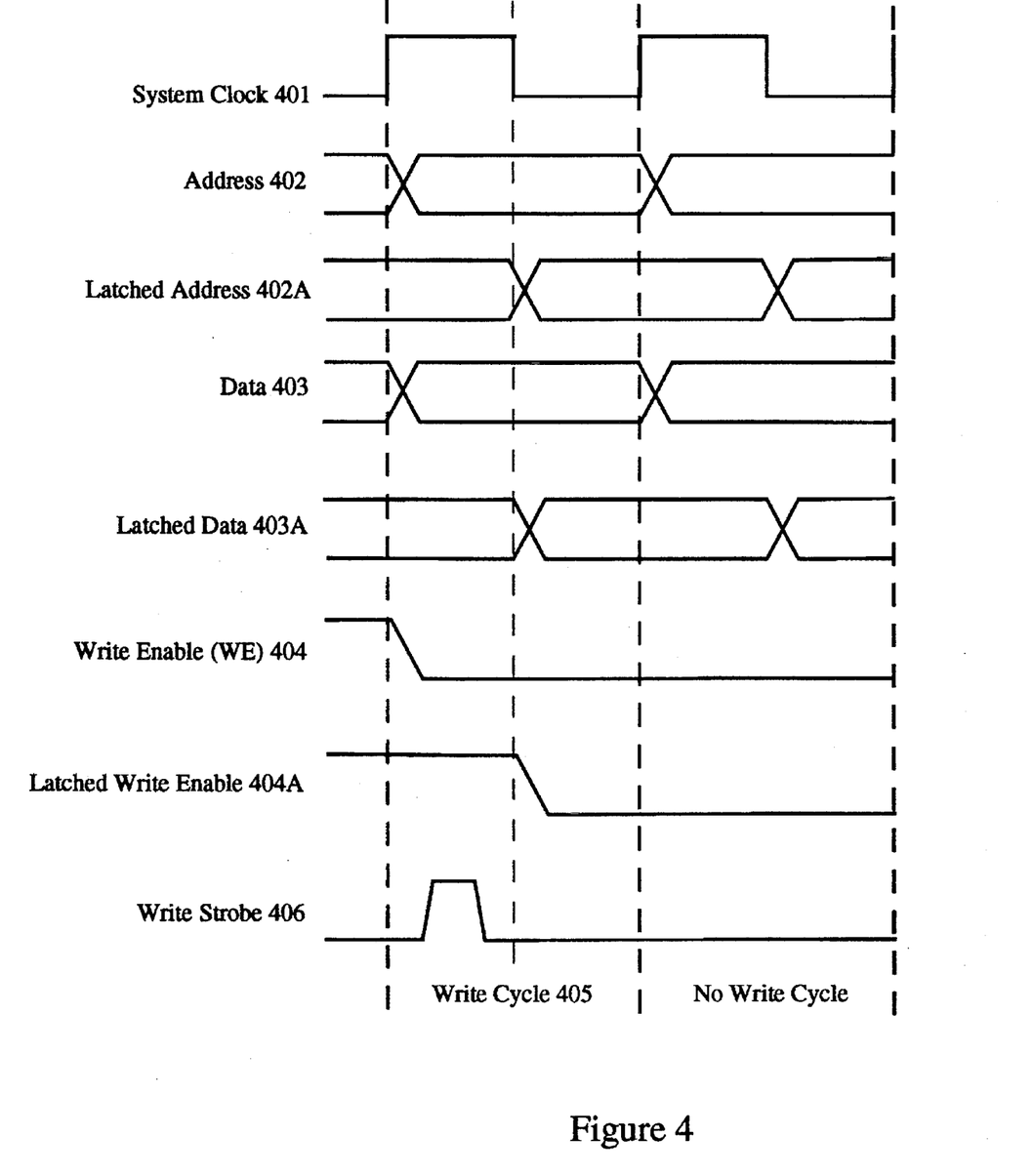
FIG. 4 shows timing diagrams for the CLB illustrated in FIG. 3.

Referring to FIG. 4, in accordance with the present invention a write operation is completed within one full period of a system clock. Specifically, a selected edge of system clock signal 401 is used to lock the address and data input signals 402 and 403, and to generate a write strobe signal 406. Address and data signals 402 and 403 are latched for the duration of the active write strobe signal 406. As explained in detail in reference to FIG. 5, the write strobe signal of the present invention is self-timed, thereby eliminating prior art timing considerations regarding the length of the active write enable signal WE 404, the stability of address and data signals 402 and 403 during an active write enable signal 404, and the hold time requirements. Specifically, the write strobe signal is self-timed such that the width of this signal is sufficient to finish the memory cell write operation. After the memory cell write operation is finished, the write strobe signal is reset. Another write cycle may be initiated by the next system clock edge (selected by the user as explained in reference to FIG. 5).

Figure 5:
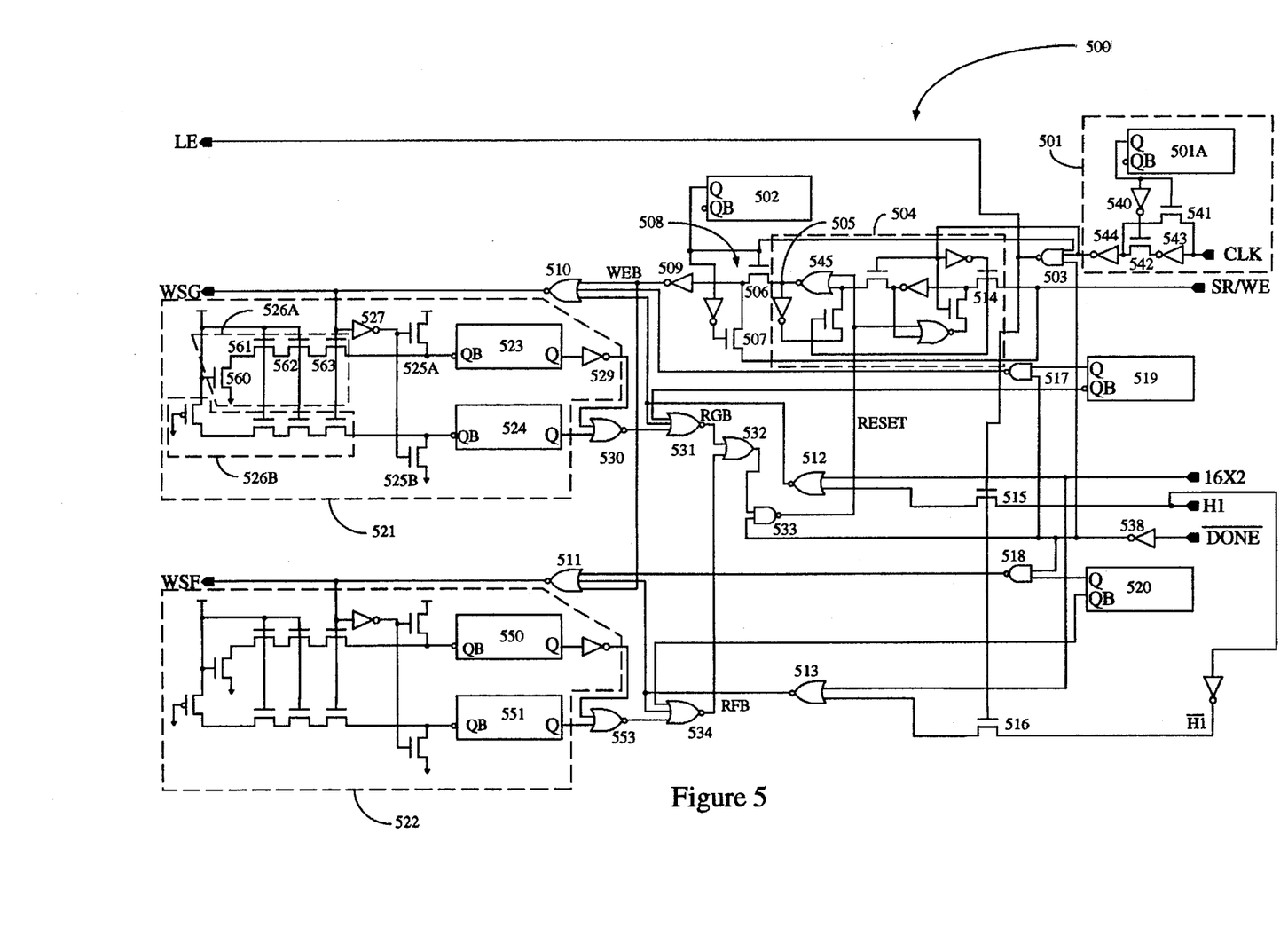
FIG. 5 illustrates the write strobe logic in one embodiment of the present invention.

FIG. 5 illustrates one embodiment of write strobe logic 500 (303 in FIG. 3) which provides synchronous functionality. Circuit 501 determines whether the write operation is triggered by a rising or falling clock signal edge. In this embodiment, a rising edge is chosen (also previously shown in FIG. 4) by storing a logic zero signal in memory cell 501A. This logic zero signal turns off transistor 541, but because it is inverted by inverter 540 turns on transistor 542. Thus, a clock signal CLK is passed via inverter 543 and transistor 542, not via transistor 541. In this manner, a rising clock edge on signal CLK is inverted by inverters 543 and 544, and then provided to NAND gate 503. Thus, the output signal of NAND gate 503, the latch enable signal LE, is determined by the other input signals to NAND gate 503.

During memory cell configuration, signal $\overline{\text{DONE}}$ is high. This high signal is then inverted by inverter 538. In this manner, a low DONE signal is provided to NAND gate 503, thereby preventing the latch enable signal LE from going low during RAM initialization. Note that this low DONE signal is also provided to NAND gate 533, thereby forcing a high output signal RESET. In this manner, flip-flop 505 is initialized to its reset state (i.e. with a zero on its Q output terminal).

However, after RAM initialization, signal $\overline{\text{DONE}}$ is changed to a logic zero. Therefore, a logic one signal is provided to NAND gates 503 and 533. In this manner, the output signals of NAND gates 503 and 533 are determined by the state of the other input signals to those gates.

The remaining input signal to NAND gate 503 is a signal provided by memory cell 502. To disable synchronous RAM functionality, memory cell 502 stores a logic low signal. This logic low signal ensures that NAND gate 503 outputs a high latch enable signal LE, thereby forcing latches 304A–304D (FIG. 3) to their transparent state. In other words, the memory cells of function generators 301 and 302 are then configured as standard RAM (i.e. without the synchronous feature). On the other hand, to enable synchronous RAM functionality, memory cell 502 stores a high signal. Thus, in a synchronous RAM enabled configuration, NAND gate 503 receives a high signal from memory cell 502 and a high DONE signal.

After a rising clock edge, circuit 501 outputs a logic one signal. Therefore, NAND gate 503 generates a low output signal. This low latch enable signal LE ensures that latches 304 remain "closed", i.e. the output signals of latches 304A–304D retain their previous values irrespective of the D input signals, as long as the latch enable signal LE is low. This latching is shown by latched address signal 402A, latched data signal 403A, and latched write enable signal 404A in the high portion of the cycle of system clock 401 (FIG. 4).

D flip-flop 504 receives the output signal of circuit 501 as a clock signal. The D input terminal of flip-flop 504 receives a write enable signal WE. The Q output terminal of flip-flop 504 is designated as node 505. The operation of flip-flop 504, which includes two conventional latches, is well known in the art, and therefore is not explained in detail herein.

Transistors 506 and 507 form a 2×1 multiplexer 508 which transfers either the write enable signal WE or the signal on node 505. Because memory cell 502 provides a logic one in the synchronous RAM enabled mode, transistor 506 is turned on, whereas transistor 507 is turned off, thereby providing the signal on node 505 to inverter 509. The state of the signal on node 505 is determined by the state of flip-flop 504. Specifically, at this time, flip-flop 504 is in a reset state (i.e. NOR gate 545 receives a logic one signal from NAND gate 533) which was forced by the high DONE signal during RAM initialization. Therefore, node 505 has a logic zero signal. This low signal, transferred by conducting transistor 506, is inverted by inverter 509 and then provided to NOR gates 510 and 511, thereby ensuring that those gates inhibit write strobe signals WSG and WSF, respectively.

Thus, after RAM initialization is completed but before an active write strobe signal is generated, write strobe signals WSG and WSF are low. These low signals initialize dummy memory cells 523, 524, 550, and 551 (described in detail below). Note that the operation of cell timing circuits 521 and 522 are identical, and therefore only cell timing circuit 521 is explained for illustration. The low write strobe signal WSG is inverted by inverter 527, thereby turning on transistors 525A and 525B. The high signal transferred by transistor 525A and the low signal transferred by transistor 525B are provided to the $\overline{\text{Q}}$ terminals of dummy memory cells 523 and 524, respectively. In this manner, dummy memory cells 523 and 524 are initialized such that the Q terminals carry a logic zero signal and a logic one signal, respectively. Inverter 529 inverts the logic zero signal. Thus, NOR gate 530 receives a logic one signal from inverter 529 and a logic one signal from dummy memory cell 524, and outputs a logic zero signal to NOR gate 531. Therefore, the output signal of NOR gate 531 depends on its other input signals.

During the high portion of the period of system clock 401 (FIG. 4), write strobe signal 406 is asserted. Specifically, the generation of this strobe signal is enabled by the rising edge of system clock signal 401 in conjunction with a high state on the latched write enable signal 404A. Referring to FIG. 5, a high clock signal CLK generates a low latch enable signal LE and at the same time triggers flip-flop 504. Thus, the logic one write enable signal WE provided to the D input terminal of flip-flop 504 is transferred to its Q output terminal (i.e. to node 505). The logic one output signal of multiplexer 508 is inverted by inverter 509 and then provided to NOR gates 510 and 511. Therefore, the states of write strobe signals WSG and WSF are determined by the other signals provided to NOR gates 510 and 511. More specifically, the state of write strobe signal WSG is determined by memory cell 519, the DONE signal, the 16×2 signal, and the input signal H1. Similarly, the state of write strobe signal WSF is determined by memory cell 520, the DONE signal, the 16×2 signal, and the input signal $\overline{H1}$.

Memory cells 519 and 520 determine whether function generators 301 and 302 are used as user writable RAM, respectively. In this embodiment, logic zero signals stored in memory cells 519 and 520 disable the user RAM capability of function generators 301 and 302. For example, a logic zero signal in memory cell 519 ensures that NAND gate 517 provides a logic one signal to NOR gate 510. That logic one signal, in turn, ensures that NOR gate 510 outputs a low (disabling) write strobe signal WSG. Similarly, a logic zero signal in memory cell 520 ensures that NAND gate 518 provides a logic one signal to NOR gate 511. That logic one signal, in turn, ensures that NOR gate 511 outputs a low (disabling) write strobe signal WSF.

On the other hand, if memory cells 519 and 520 store logic one signals, then NAND gates 517 and 518 both receive two logic one signals (recall the DONE signal is a logic one signal after RAM initialization). Therefore, NAND gates 517 and 518 output logic zero signals to NOR gates 510 and 511, respectively. Thus, the write strobe signals WSG and WSF are then dependent on the signals provided by NOR gates 512 and 513, respectively. If the 16×2 signal is low, thereby indicating that data signal DIN is written to one of the function generators, then input signal H1 determines which write strobe signal WSG or WSF goes high. On the other hand, if the 16×2 signal is high, then irrespective of the state of signal H1, both write strobe signals WSG and WSF go high. For purposes of illustration, the 16×2 signal is assumed to be high. Thus, both strobe signals WSG and WSF go high, thereby indicating that a write operation is in process. Note that in other embodiments of the present invention memory cells 519 and 520 store different logic signals.

Circuits 521 and 522 provide cell timing during a write operation. Each circuit includes two dummy memory cells. For example, circuit 521 includes dummy memory cells 523 and 524. The $\overline{Q}$ terminals of those memory cells are coupled to a plurality of transistors designed to emulate the write data paths of the memory cells in function generators 301 and 302. Specifically, transistors 560–563 emulate the n-channel transistor of inverter 600 and illustrative transistors 601–603 (FIG. 6B), respectively. Note that to ensure appropriate timing margin, transistor 560 is sized smaller than the n-channel transistor of inverter 600. Note that the p-channel transistor of circuit 526B is sized smaller than the p-channel transistor of inverter 600. The $\overline{Q}$ terminal of dummy memory cell 523 is provided either a logic one signal from transistor 525A or a logic zero signal from a plurality of transistors 526A. In contrast, the $\overline{Q}$ terminal of dummy memory cell 524 is provided a logic zero signal from either transistor 525B or a logic one from a plurality of transistors 526B.

If, for example, write strobe signal WSG goes high, then transistors 525A and 525B (via inverter 527) are turned off, and the plurality of transistors 526A are turned on. In this manner, dummy memory cell 523 is written to provide a logic one signal on its Q terminal and dummy memory cell 524 is written to provide a logic zero on its Q terminal. In other words, during an active write enable strobe signal, dummy memory cells 523 and 524 are written to their respective opposite states. Therefore, NOR gate 530 receives logic zero signals from both inverter 529 and dummy memory cell 524, and outputs a logic one signal. This logic one signal indicates that both dummy memory cells 523 and 524 have been successfully written to. In accordance with the present invention, the time for the RAM cells in function generator 301 (FIG. 3) to be written to (either a logic one or a logic zero) is the same for dummy memory cells 523 and 524. Thus, if NOR gate 530 outputs a logic one signal, the RAM cells in function generator 301 have also completed their write operation.

Because circuit 522 operates in the identical manner described above for circuit 521, after the RAM cells in function generators 301 and 302 have completed their write operation, NOR gate 553 also generates a logic one output signal. A logic one signal from NAND gates 530 and 553 ensures that NOR gates 531 and 534 both provide logic zero signals to OR gate 532. Therefore, OR gate 532 outputs a logic zero signal to NAND gate 533. The OR gate 532 is provided to ensure that the write operations associated with both function generators 301 and 302 are completed. The logic zero output signal of OR gate 532 forces NAND gate 533 to provide a logic one (active) RESET signal, thereby resetting flip-flop 504. A high RESET signal forces write enable signal WEB to go high. NOR gates 510 and 511, which receive that high WEB signal, then output low (disabling) write strobe signals WSG and WSF.

If memory cells 519 and 520 store logic one signals (indicating an enabled RAM capability for both function generators 301 and 302), then logic zero signals are provided to NOR gates 531 and 534. Thus, reset signals RGB and RFB associated with function generators 301 and 302, respectively, depend on the other signals provided to NOR gates 531 and 534. Note that NOR gate 512, for example, provides a logic one signal to NOR gate 531 (thereby initiating a reset operation) only if the input signal H1 and the 16×2 signal are low. Similarly, NOR gate 513 provides a logic one signal to NOR gate 534 only if the input signal $\overline{H1}$ and the 16×2 signal are low. If the 16×2 signal is low, then one of the function generators 301 and 302 are written to using data signals DIN. Therefore, input signal Hi determines which reset signal RGB or RFB goes high. In other words, this reset operation occurs depending on the other signals provided to NOR gates 531 and 534 (i.e. signals from memory cell 519 and NOR gate 530 for NOR gate 531, and signals from memory cell 520 and NOR gate 553 for NOR gate 534). In other words, logic zero signals in memory cells 519 and 520 indicate that function generators 301 and 302 (the G and F function generators, respectively) are being used only for read operations (ROM). Therefore, other signals provided to NOR gates 531 and 534, such as signals from timing circuits 521 and 522 (explained in detail above) are ignored. If both NOR gates 531 and 534 receive logic one signals, then both gates output logic zero signals to OR gate 532, thereby ensuring that NAND gate 533 provides a logic one flip-flop reset signal RESET. This high signal, provided to NOR gate 545, ensures that a low signal is provided on node 505. Thus, active write strobe signals WSG and WSF are not generated.

If only one function generator reset signal, i.e. reset signal RGB or reset signal RFB, is low, then OR gate 532 outputs a logic one. Thus, the output signal of NAND gate 533 depends the state of the DONE signal. As mentioned previously, after RAM initialization, the $\overline{\text{DONE}}$ signal is a logic zero. Therefore, NAND gate 533 receives two logic one signals, thereby outputting a logic zero RESET signal (i.e. not resetting flip-flop 504).

The data input for the synchronous RAM in various configurations (e.g. 16×2, 32×1, etc.) are the same as the corresponding configurations in a Xilinx XC4000 RAM, and therefore are not explained in detail herein.

The embodiments described above are illustrative only and not limiting. Those skilled in the art will recognize other embodiments and variations of the present invention which is set forth in the appended claims.

We claim:

1. A structure for a programmable logic device comprising:
    a first logic generator having a Read Address terminal and a Write Address Terminal;
    a second logic generator having a Read Address terminal and a Write Address Terminal;
    addressing circuitry coupled to said Read and Write Address terminals of said first and second logic generators, wherein a control signal provided to said addressing circuitry provides a signal to the Write Address terminals of said first and second logic generators.

2. The structure of claim 1 wherein said addressing circuitry includes a multiplexer which selectively provides said signal.

3. The structure of claim 2 wherein said addressing circuitry further includes a first latch coupled between said multiplexer and said Write Address terminal of said first logic generator.

4. The structure of claim 3 wherein said addressing circuitry further includes a second latch coupled between said addressing circuitry and said Write Address terminal of said second logic generator.

5. The structure of claim 2 wherein said addressing circuitry includes a first address decoder for providing a first input signal to said multiplexer and said Read Address terminal of said first logic generator.

6. The structure of claim 5 wherein said addressing circuitry includes a second address decoder for providing a second input signal to said multiplexer and said Read Address terminal of said second logic generator.

7. A configurable logic block configuration comprising:
    a first set of random access memory cells;
    a second set of random access memory cells;
    first addressing means for providing a first Read address signal to address one of said first set of random access memory cells;
    second addressing means for providing a second Read address signal to address one of said second set of random access memory cells; and
    means for selectively providing said first Read signal or said second Read address signal to write to one of said first set of random access memory cells.

8. The configurable logic block of claim 7 wherein said means for selectively providing includes a multiplexer.

9. The configurable logic block of claim 8 wherein said first addressing means includes an address decode circuit coupled to an input terminal of said multiplexer.

10. The configurable logic block of claim 8 wherein said second addressing means includes an address decode circuit coupled to an input terminal of said multiplexer.

* * * * *

UNITED STATES PATENT AND TRADEMARK OFFICE
CERTIFICATE OF CORRECTION

PATENT NO. : 5,631,577
DATED : May 20, 1997
INVENTOR(S) : Freidin, Philip M.

It is certified that error appears in the above-indentified patent and that said Letters Patent is hereby corrected as shown below:

On the title page, under the section titled "Inventors" delete "Edmond Y. Cheung, San Jose; Charles R. Erickson; Tsung-Lu Syu, both of Fremont, all of Calif."

On the title page, under the section titled "References Cited, U.S. Patent Documents" insert the following:

-- 5,336,950  8/94  Popli et al.  307/465
   5,349,250  9/94  New           307/465
   5,425,036  6/95  Liu et al.    371/23 --

Col. 2, line 55, delete "i.g." and insert --i.e.--.

Col. 8, line 49, delete "Hi" and insert --H1--.

Col. 9, line 4, after "depends" insert --on--.

Signed and Sealed this

Twenty-eighth Day of October, 1997

Attest:

BRUCE LEHMAN

*Attesting Officer*   Commissioner of Patents and Trademarks